US008652915B2

United States Patent
Ahn et al.

(10) Patent No.: US 8,652,915 B2
(45) Date of Patent: Feb. 18, 2014

(54) METHODS OF FABRICATING SEMICONDUCTOR DEVICES USING PRELIMINARY TRENCHES WITH EPITAXIAL GROWTH

(75) Inventors: Kevin Ahn, Hwaseong-si (KR); Sang-Jine Park, Yongin-si (KR); Jae-Jik Baek, Seongnam-si (KR); Bo-Un Yoon, Seoul (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 13/212,380

(22) Filed: Aug. 18, 2011

(65) Prior Publication Data
US 2012/0058616 A1    Mar. 8, 2012

(30) Foreign Application Priority Data
Sep. 2, 2010   (KR) .................. 10-2010-0086072

(51) Int. Cl.
*H01L 21/336* (2006.01)
(52) U.S. Cl.
USPC ............. 438/300; 257/E21.619; 257/E21.634
(58) Field of Classification Search
USPC .................. 438/285, 478, 245, 246, 248, 300; 257/E21.619, E21.634
See application file for complete search history.

(56) References Cited

U.S. PATENT DOCUMENTS

| | | | | |
|---|---|---|---|---|
| 5,991,487 | A * | 11/1999 | Sugiyama | 385/129 |
| 6,077,736 | A * | 6/2000 | Hwang et al. | 438/231 |
| 6,240,933 | B1 * | 6/2001 | Bergman | 134/1.3 |
| 7,045,407 | B2 * | 5/2006 | Keating et al. | 438/198 |
| 7,303,999 | B1 * | 12/2007 | Sriraman et al. | 438/719 |
| 7,378,305 | B2 * | 5/2008 | Hatada et al. | 438/153 |
| 7,510,925 | B2 | 3/2009 | Miyanami | |
| 7,544,994 | B2 * | 6/2009 | Schepis et al. | 257/327 |
| 7,629,218 | B2 * | 12/2009 | Lee et al. | 438/256 |
| 7,667,227 | B2 * | 2/2010 | Shimamune et al. | 257/19 |
| 8,067,281 | B1 * | 11/2011 | Chen et al. | 438/218 |
| 2008/0283906 | A1 * | 11/2008 | Bohr | 257/327 |

FOREIGN PATENT DOCUMENTS

KR   1020030045935 A    6/2003

* cited by examiner

*Primary Examiner* — Jarrett Stark
*Assistant Examiner* — Mohammad M Hoque
(74) *Attorney, Agent, or Firm* — Myers Bigel Sibley & Sajovec, P.A.

(57) ABSTRACT

A method of fabricating a semiconductor device can be provided by etching sidewalls of a preliminary trench in a substrate that are between immediately adjacent gate electrode structures, to recess the sidewalls further beneath the gate electrode structures to provide recessed sidewalls. Then, the recessed sidewalls and a bottom of the preliminary trench can be etched using crystallographic anisotropic etching to form a hexagonally shaped trench in the substrate.

16 Claims, 8 Drawing Sheets

US 8,652,915 B2

METHODS OF FABRICATING SEMICONDUCTOR DEVICES USING PRELIMINARY TRENCHES WITH EPITAXIAL GROWTH

CROSS-REFERENCE TO RELATED APPLICATION

This application claims priority from Korean Patent Application No. 10-2010-0086072 filed on Sep. 2, 2010, in the Korean Intellectual Property Office, and all the benefits accruing therefrom under 35 U.S.C. 119, the contents of which in its entirety are herein incorporated by reference.

BACKGROUND

The present invention relates to the field of electronics, and more particularly, to method of fabricating semiconductor devices.

Recently, in order to increase the operating current of a semiconductor device, mechanical stress can be applied to the device to adjust the stress of a channel. That is to say, the operating current can be improved based on the principle that carrier mobility is affected when stress is applied to a channel.

When a compressive stress is applied to a channel region of a PMOS transistor, hole mobility is increased.

For example, a compressive stress may be applied to a channel region of a PMOS transistor by forming a trench in a source/drain region of a PMOS transistor and forming a SiGe layer in the trench. Here, the compressive stress applied to a channel region may be increased by forming the SiGe layer to be closer to the channel region.

SUMMARY

In some embodiments according to the inventive concept, methods of fabricating semiconductor devices using preliminary trenches with epitaxial growth can be provided. Related devices can also be provided. Pursuant to these embodiments, methods of fabricating a semiconductor device can be provided by forming a gate electrode on a substrate. A spacer can be formed on sidewalls of the gate electrode. A predetermined portion of the substrate exposed by the spacer and the gate electrode can be etched to form a first preliminary trench. A sacrificial layer can be formed on a bottom surface of the first preliminary trench. The sidewalls of the first preliminary trench exposed by the sacrificial layer can be laterally etched to form a second preliminary trench. The sacrificial layer can be removed and the second preliminary trench can be etched to form a trench. A SiGe epitaxial layer can be formed in the trench In some embodiments according to the inventive concept, a method of fabricating a semiconductor device can be provided by etching sidewalls of a preliminary trench in a substrate that are between immediately adjacent gate electrode structures, to recess the sidewalls further beneath the gate electrode structures to provide recessed sidewalls. Then, the recessed sidewalls and a bottom of the preliminary trench can be etched using crystallographic anisotropic etching to form a hexagonally shaped trench in the substrate.

In some embodiments according to the inventive concept, the method can further include epitaxially growing a SiGe layer in the hexagonally shaped trench. In some embodiments according to the inventive concept, etching the recessed sidewalls can be provided by etching the recessed sidewalls to form outermost tips of the hexagonally shaped trench beneath the immediately adjacent gate electrode structures. In some embodiments according to the inventive concept, the outermost tips are aligned to sidewalls of the immediately adjacent gate electrode structures.

In some embodiments according to the inventive concept, the outermost tips are about 7 nm or less beneath a surface of the substrate.

In some embodiments according to the inventive concept, etching sidewalls of a preliminary trench is preceded by forming a sacrificial layer on a bottom surface preliminary trench. In some embodiments according to the inventive concept, forming a sacrificial layer on a bottom surface preliminary trench can be provided by forming the sacrificial layer on the bottom surface preliminary trench and exposing at least a portion of the sidewall of the preliminary trench.

In some embodiments according to the inventive concept, a semiconductor device can include immediately adjacent gate electrode structures on a substrate and a hexagonally shaped SiGe compressive strain layer in the substrate between the immediately adjacent gate electrode structures. The immediately adjacent gate electrode structures can include opposing sidewalls with outermost tips that extend beneath the immediately adjacent gate electrode structures.

DETAILED DESCRIPTION OF EMBODIMENTS ACCORDING TO THE INVENTIVE CONCEPT

Figure 1:
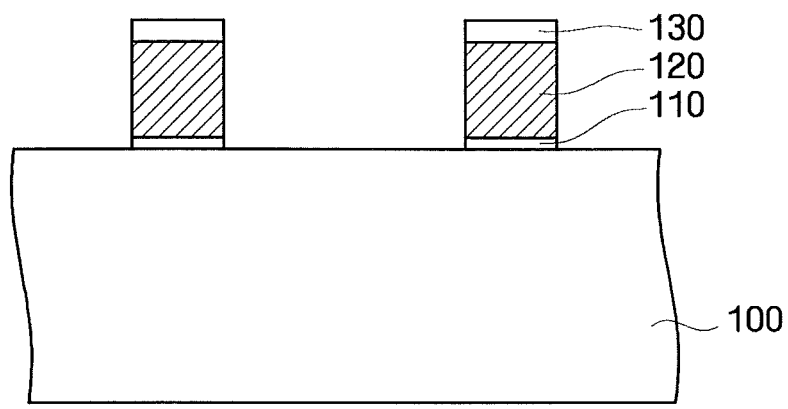
FIGS. 1 to 7 and FIGS. 9 to 11 are cross-sectional views illustrating methods of fabricating semiconductor devices according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A method of fabricating a semiconductor device according to an embodiment of the present invention will be described with reference to FIGS. 1 to 12.

Figure 4:
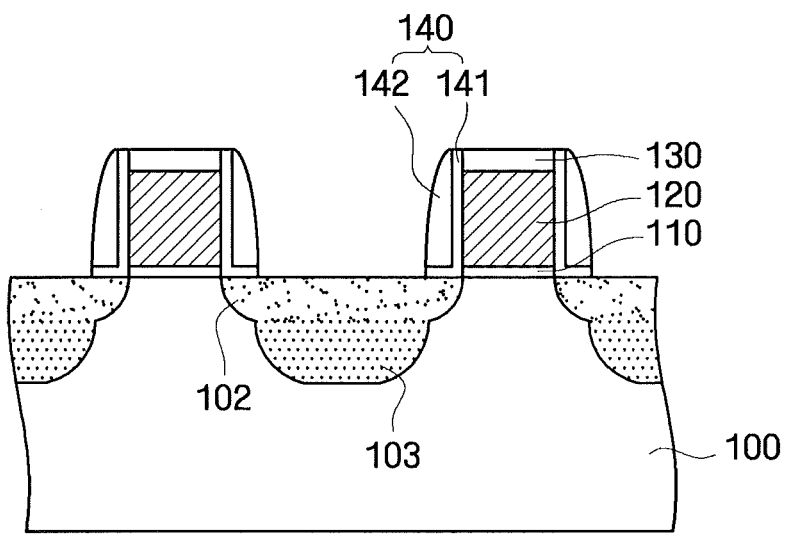
Figure 5:
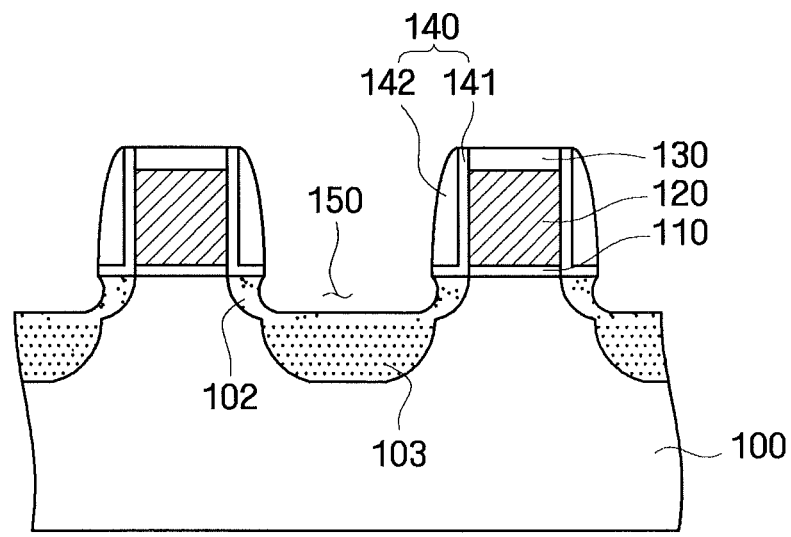
Figure 6:
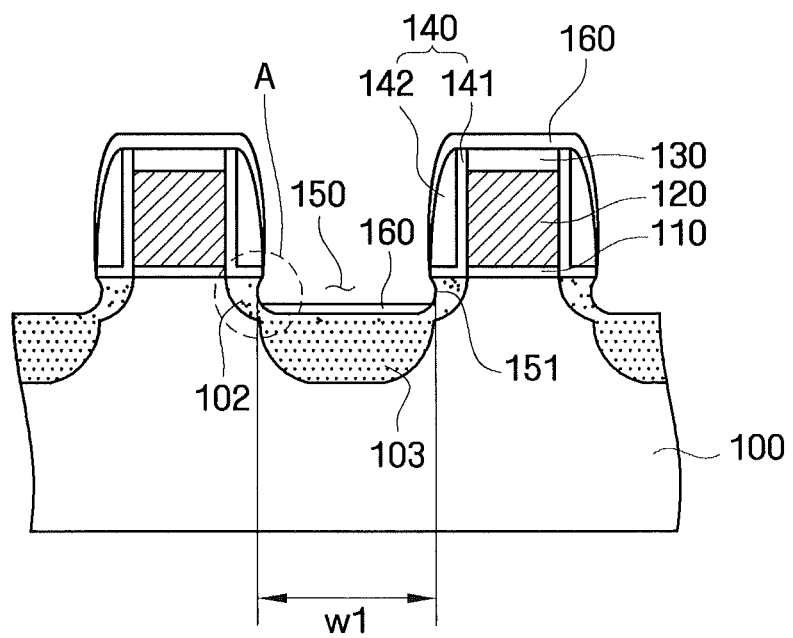
Figure 7:
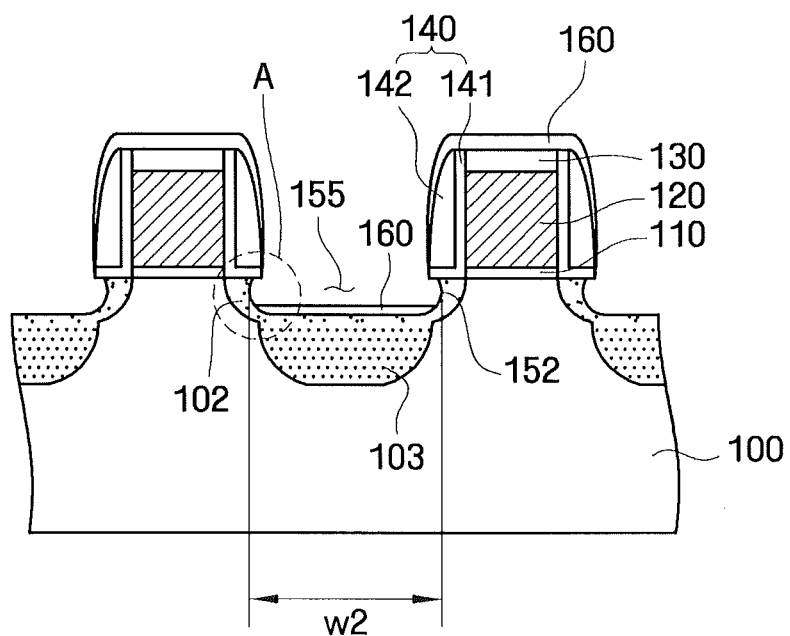
Figure 8:
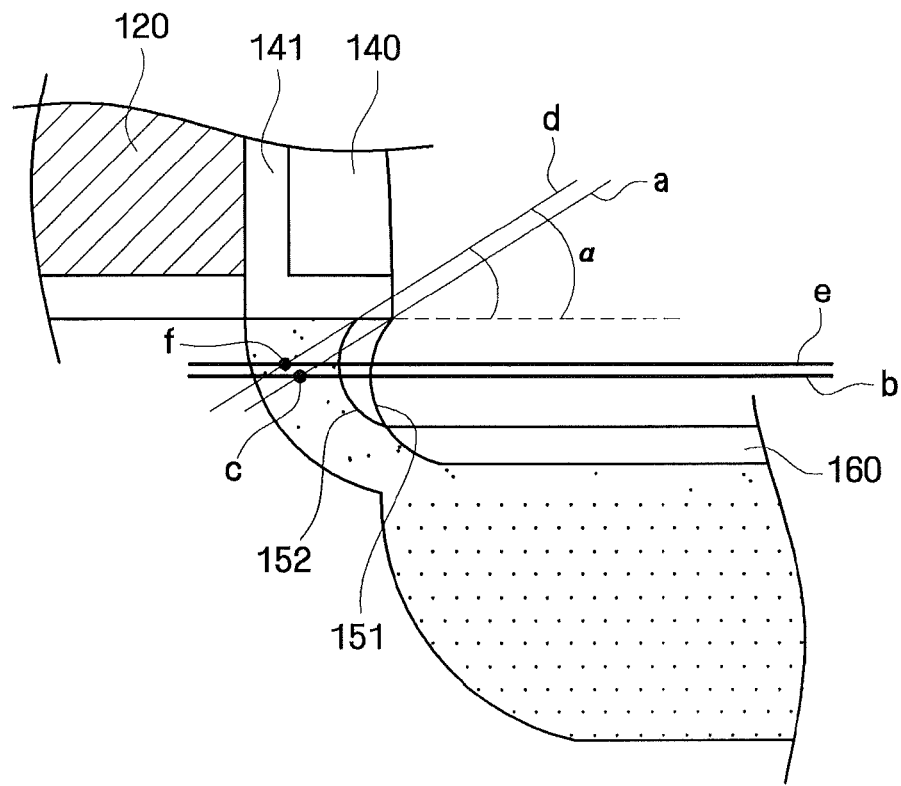
FIG. 8 is an enlarged view of an 'A' portion of FIGS. 6 and 7.
Figure 9:
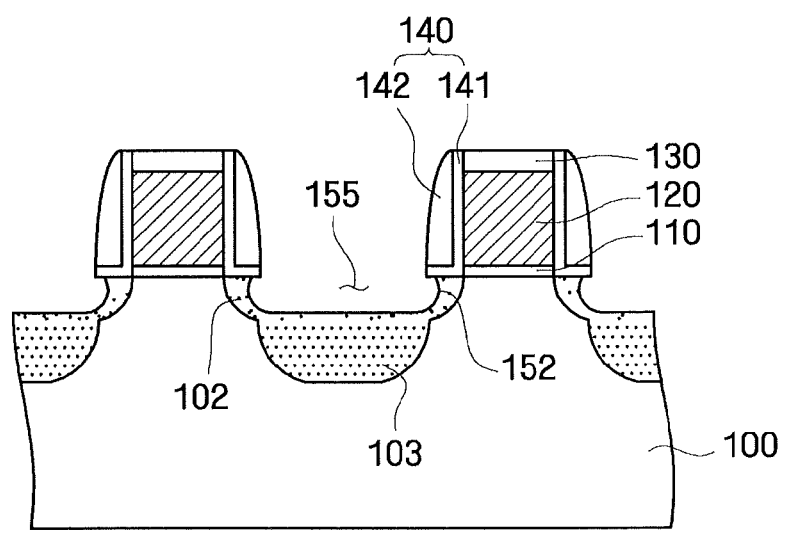
Figure 10:
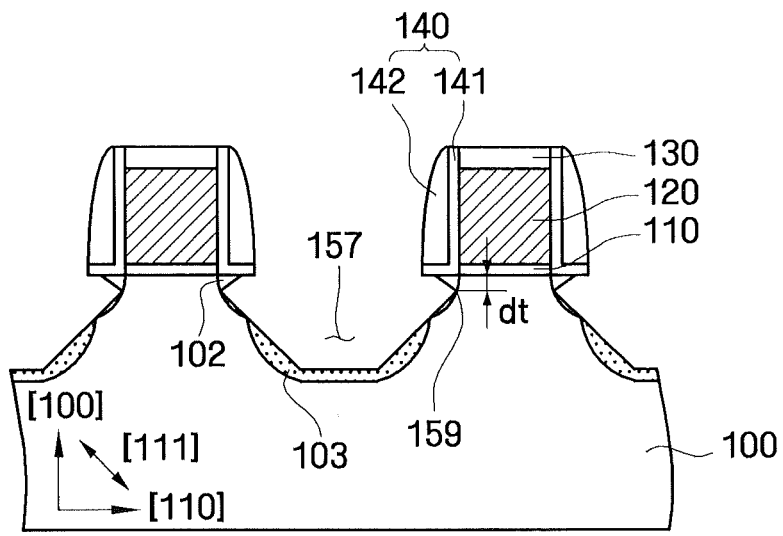
Figure 11:
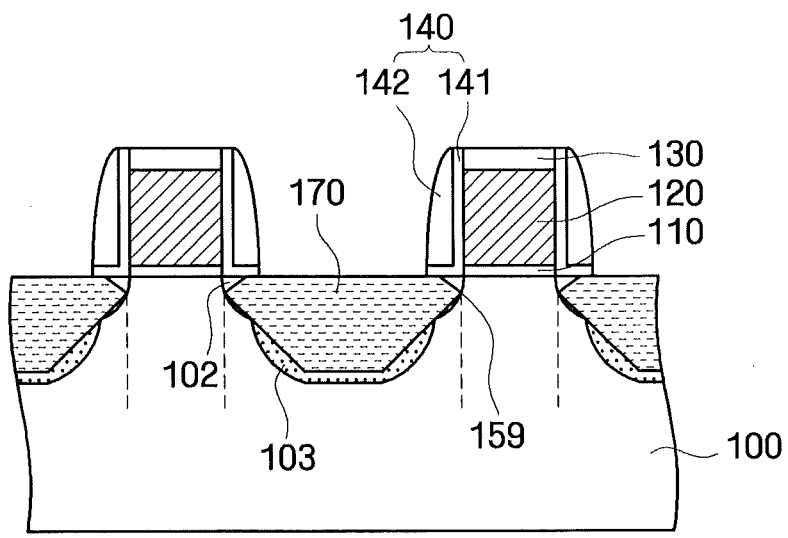
Figure 12:
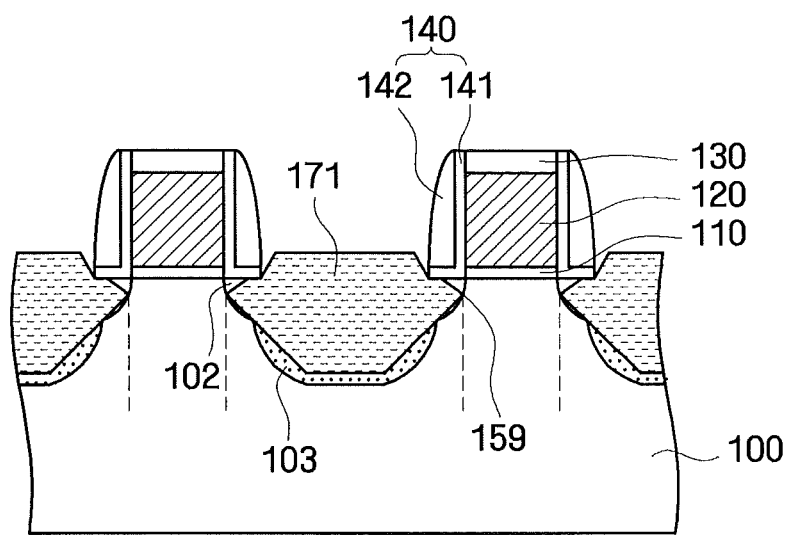
FIG. 12 illustrates a modified example of FIG. 11.

FIGS. 1 to 7 and FIGS. 9 to 11 are cross-sectional views sequentially illustrating a method of fabricating a semiconductor device according to an embodiment of the present invention, FIG. 8 is an enlarged view of an 'A' portion of FIGS. 6 and 7, and FIG. 12 illustrates a modified example of FIG. 11.

Referring to FIG. 1, a substrate 100 is divided into an active region and an inactive region by a device isolation region such as a shallow trench isolation (STI) or field oxide (FOX) region. The substrate 100 may be a rigid substrate such as a silicon substrate, a silicon on insulator (SOI) substrate, a gallium arsenic substrate, a silicon germanium substrate, a ceramic substrate, a quartz substrate, and a display glass substrate, or a flexible plastic substrate made of, for example, polyimide, polyethylene terephthalate (PET), polyethylene naphthalate (PEN), polymethyl methacrylate (PMMA), polycarbonate (PC), polyethersulfone (PES), or polyester.

The gate insulating layer 110 may include a silicon oxide, SiON, $Ge_xO_yN_z$, $Ge_xSi_yO_z$, a high-k dielectric material or a combination thereof, or a stacked of these materials, which is formed by thermally oxidizing the substrate 100. Here, the high-k dielectric material may include, but not limited to, $HfO_2$, $ZrO_2$, $Al_2O_3$, $Ta_2O_5$, hafnium silicate, zirconium silicate, a combination thereof.

A gate insulating layer 110, a gate electrode 120, and a gate capping layer 130 are formed on the active region of the substrate 100. The gate electrode 120 may be formed of poly-Si, poly-SiGe, doped poly-Si, or a metal such as Ta, TaN, TaSiN, TiN, Mo, Ru, Ni, or NiSi, or a stacked layer having these metals sequentially stacked. The gate capping layer 130 may be formed of, for example, SiN, or SiON.

Figure 2:
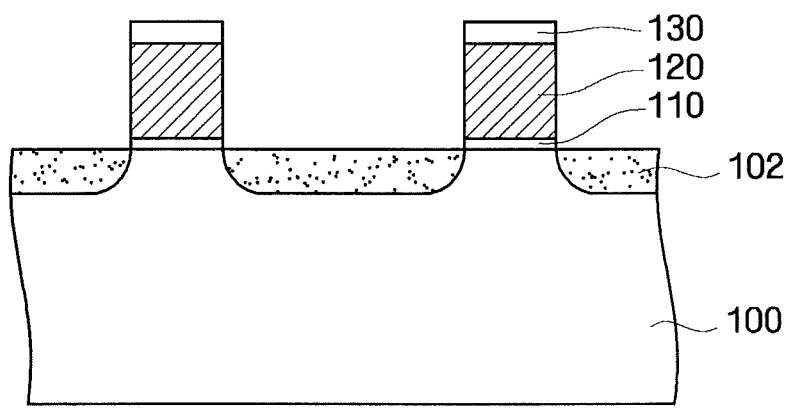

Referring to FIG. 2, a low concentration impurity ion implant is performed into the substrate 100 using the gate insulating layer 110, the gate electrode 120, and the gate capping layer 130 as ion implantation masks to form a lightly doped impurity region 102. In a case of a PMOS transistor, p-type impurity, e.g., boron (B) or gallium (Ga), may be used. In a case of an NMOS transistor, n-type impurity, e.g., phosphorus (P) or arsenic (As), may be used. A region under the gate electrode 120 between lightly doped impurity regions 102 is a channel region.

Figure 3:
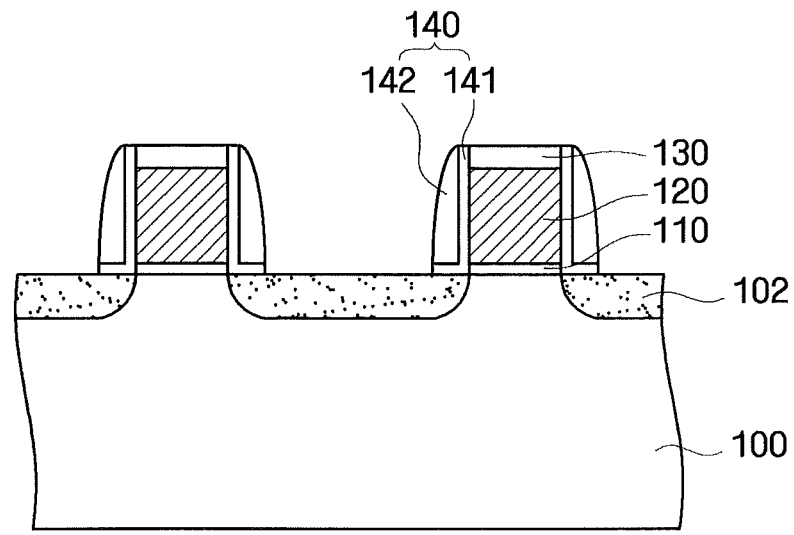

Referring to FIG. 3, a spacer 140 is formed on sidewalls of the gate insulating layer 110, the gate electrode 120, and the gate capping layer 130. The spacer 140 may include a first spacer 141 and a second spacer 142. The spacer 140 may be formed by sequentially forming a first spacer forming insulating layer and a second spacer forming insulating layer on the entire surface of the substrate 100 having the gate insulating layer 110, the gate electrode 120, and the gate capping layer 130, and then etching the first spacer forming insulating layer and the second spacer forming insulating layer using blanket etching such as an etch back process. The first spacer 141 may be formed of a silicon oxide layer, and the second spacer 142 may be formed of a silicon nitride layer.

Referring to FIG. 4, a high concentration impurity ion implant is performed into the substrate 100 using the gate electrode 120, the gate capping layer 130 and the spacer 140 as ion implantation masks to form a heavily doped impurity region 103.

Referring to FIG. 5, a predetermined region of the substrate 100 exposed by the gate electrode 120, the gate capping layer 130 and the spacer 140 is etched to form a first preliminary trench 150. The forming of the first preliminary trench 150 may be performed using an etch back process. The etch back process may be dry etching using a gas containing argon (Ar) or helium (He) as a carrier gas, $NF_3$ and $Cl_2$ or a gas containing HBr and $Cl_2$. The first preliminary trench 150 may be formed in the lightly/heavily doped impurity regions 102 and 103. The first preliminary trench 150 may not expose a bottom surface of the spacer 140.

Referring to FIG. 6, a sacrificial layer 160 is formed on the entire surface of the substrate 100 having the first preliminary trench 150. The sacrificial layer 160 may be formed of a material having high etching selectivity with respect to the substrate 100, using, for example, a high-density plasma (HDP) oxide layer. It is possible to easily adjust a direction in which the HDP oxide layer is formed. Therefore, the sacrificial layer 160 may be formed only on a bottom surface of the first preliminary trench 150 while exposing sidewall 151 of the first preliminary trench 150 by forming the sacrificial layer 160 using the HDP oxide layer. The sacrificial layer 160 may be formed on the spacer 140 and the gate capping layer 130.

Referring to FIG. 7, the sidewall 151 of the first preliminary trench 150 exposed by the sacrificial layer 160 is laterally etched to form a second preliminary trench 155. The laterally etching of the sidewall 151 of the first preliminary trench 150 may be performed by dry etching. The dry etching may be performed using, for example, $NF_3$ or $Cl_2$ gas. However, the present invention is not limited to the etching illustrated herein, but the sidewall 151 of the first preliminary trench 150 may be laterally etched by wet etching. The wet etching may be performed using, for example, an etching solution having a mixture of deionized water (DIW), and hydrogen peroxide. The bottom surface of the first preliminary trench 150 covered by the sacrificial layer 160 is not etched, so that a predetermined region of the substrate 100 covered by the sacrificial layer 160 can be protected. If the sidewall 151 of the first preliminary trench 150 is laterally etched, the bottom surface of the spacer 140 may be partially exposed.

Referring to FIGS. 6 and 7, assuming that the maximum width of the first preliminary trench 150 is denoted by w1 and the maximum width of the second preliminary trench 155 is denoted by w2, w2 is greater than w1. That is to say, referring to FIG. 8, a sidewall 152 of the second preliminary trench 155 is closer to the channel region than the sidewall 151 of the first preliminary trench 150. In the illustrated embodiment, the use of the sacrificial layer 160 allows the substrate 100 to be laterally etched while preventing the substrate 100 is etched depthwise, thereby allowing the sidewall 152 of the second preliminary trench 155 to be formed closer to the channel region than the sidewall 151 of the first preliminary trench 150.

In addition, referring to FIGS. 6 to 8, a location at which the second preliminary trench 155 has the maximum width is closer to the top surface of the substrate 100 than a location at which the first preliminary trench 150 has the maximum width. By doing so, a tip (159 of FIG. 10) of the epitaxial layer forming trench (157 of FIG. 10) formed using the second preliminary trench 155 in a subsequent process may be formed to be much closer to the channel region. For example, the tip 159 of the epitaxial layer forming trench 157 may be formed to be aligned with the sidewall of the gate electrode 120. As the tip 159 of the epitaxial layer forming trench 157 is closer to the channel region, the compressive stress applied to the channel region by the SiGe epitaxial layer 170 formed in the epitaxial layer forming trench 157) may further be increased.

Referring to FIGS. 6 to 8, in cases where the epitaxial layer forming trench 157 is immediately formed from the first preliminary trench 150 without forming the second preliminary trench 155 and where the epitaxial layer forming trench 157 is formed from the second preliminary trench 155, the location where the tip 159 of the epitaxial layer forming trench 157 is formed will now be described.

First, the case where the epitaxial layer forming trench 157 is immediately formed from the first preliminary trench 150 without forming the second preliminary trench 155 will now be described. Assuming that a contact line formed when a straight line having a constant slope with respect to the top surface of the substrate 100, for example, a straight line forming an angle (α) of 54 degrees with respect to the top surface of the substrate 100, contacts the first preliminary trench 151, is referred to a first contact line (a), and a straight line parallel with the top surface of the substrate 100 at a location where the first preliminary trench 151 has the maximum width is referred to a first horizontal line (b), the tip 159 of the epitaxial layer forming trench 157 is formed at a point (c) where the first contact line (a) meets the first horizontal line (b).

Next, the case where the epitaxial layer forming trench 157 is formed from the second preliminary trench 155, the location where the tip 159 of the epitaxial layer forming trench 157 is formed will now be described. Assuming that a contact line formed when a straight line having a constant slope with respect to the top surface of the substrate 100, for example, a straight line forming an angle (α) of 54 degrees with respect to the top surface of the substrate 100, contacts the second preliminary trench 155, is referred to a second contact line (d), and a straight line parallel with the top surface of the substrate 100 at a location where the second preliminary trench 155 has the maximum width is referred to a first horizontal line (e), the tip 159 of the epitaxial layer forming trench 157 is formed at a point (f) where the second contact line (d) meets the second horizontal line (e).

Referring to FIG. 8, the point (f) where the second contact line (d) meets the second horizontal line (e) is closer to the channel region than the point (c) where the first contact line (a) meets the first horizontal line (b).

Referring to FIG. 9, the sacrificial layer 160 is removed. In a case where the sacrificial layer 160 is formed of a HDP oxide layer, the sacrificial layer 160 may be removed by sequentially performing, for example, cleaning using $O_3HF$ and plasma native oxide cleaning (PNC) or pre native oxide cleaning.

Referring to FIG. 10, the second preliminary trench 155 is etched to form an epitaxial layer forming trench 157. The etching of the second preliminary trench 155 (without the sacrificial layer 160) may be performed by wet etching. The wet etching may be crystallographic anisotropic etching. An etching solution such as KOH, NaOH, $NH_4OH$, or tetramethyl ammonium hydroxide (TMAH) may be used in the crystallographic anisotropic etching based on wet etching. The epitaxial layer forming trench 157 may be formed in the lightly/heavily doped impurity regions 102 and 103. Here, the lightly/heavily doped impurity regions 102 and 103 may remain at the periphery of the epitaxial layer forming trench 157.

The use of the crystallographic anisotropic etching allows the substrate 100 to be etched at different etching rates according to the crystalline orientation. For example, if a horizontal plane of the substrate 100 has a [100] crystalline orientation, a vertical plane of the substrate 100 has a [110] crystalline orientation, and a diagonal plane of the substrate 100 has a [111] crystalline orientation, the substrate 100 is etched in order of the horizontal plane having [100] crystalline orientation, the vertical plane having [110] crystalline orientation, and the diagonal plane having [111] crystalline orientation. Accordingly, the epitaxial layer forming trench 157 formed by the crystallographic anisotropic etching may have a hexagonal (sigma) shape.

As a depth dt ranging from a top surface of the substrate 100 to the tip 159 where the epitaxial layer forming trench 157 has the maximum width is reduced, the compressive stress applied to the channel region may be increased by a SiGe epitaxial layer (170 of FIG. 11) formed in an epitaxial layer forming trench (157 of FIG. 10). For example, the depth dt from the top surface of the substrate 100 to the tip 159 where the epitaxial layer forming trench 157 has the maximum width may be approximately 7 nm or less. In addition, the tip 159 may be aligned with a sidewall of a gate electrode 120. Here, the compressive stress applied to the channel region may be increased by the SiGe epitaxial layer (170 of FIG. 11) formed in an epitaxial layer forming trench (157 of FIG. 10) may further be increased.

As described above, in the illustrated embodiment of the present invention, the sacrificial layer 160 is formed under the first preliminary trench 150 and the sidewall of the first preliminary trench 150 exposed by the sacrificial layer 160 is laterally exposed, thereby increasing the width of the second preliminary trench 155 and allowing the tip 159 of the epitaxial layer forming trench 157 formed using the second preliminary trench 155 to be positioned close to the channel region.

Referring to FIG. 11, the SiGe epitaxial layer 170 is formed in the epitaxial layer forming trench 157. An epitaxial process for forming the SiGe epitaxial layer 170 may be performed at a temperature in a range of approximately 500 to approximately 900 degrees Centigrade at 1 to 500 Torr, which may be appropriately adjusted within the scope of the invention. In addition, $SiH_4$, $SiH_2Cl_2$, $SiHCl_3$, $SiCl_4$, $SiH_xCl_y$ (x+y=4), $Si(OC_4H_9)_4$, $Si(OCH_3)_4$, or $Si(OC_2H_5)_4$ may be used as a silicon source gas, and $GeH_4$, $GeCl_4$, or $GeHxCly$ (x+y=4) may be used as a Ge source gas, but not limited thereto. The SiGe epitaxial layer 170 may be formed by in situ doping of impurity ions.

A top surface of the SiGe epitaxial layer 170 may be formed as high as the top surface of the substrate 100. Alternatively, as shown in FIG. 12, the top surface of the SiGe epitaxial layer 171 may be formed to be higher than the top surface of the substrate 100.

Figure 13:
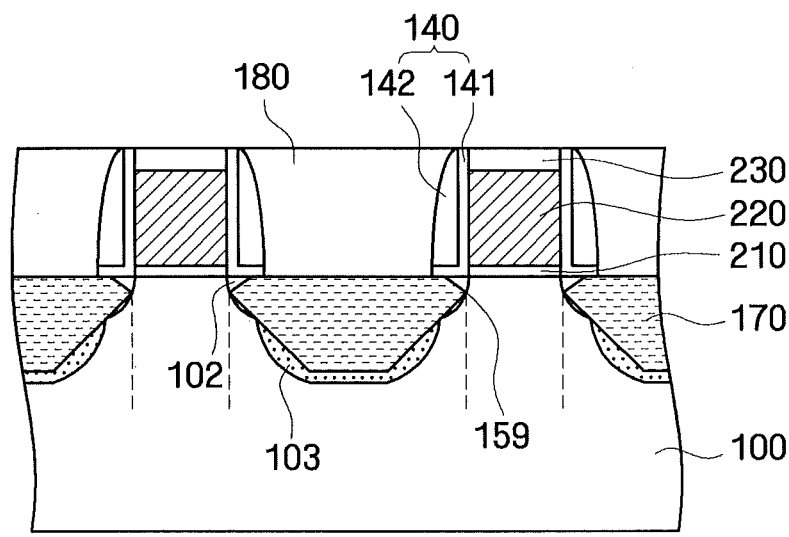
FIGS. 13 to 15 are cross-sectional views illustrating intermediate stages in methods of fabricating semiconductor devices according to embodiments of the present invention.
Figure 14:
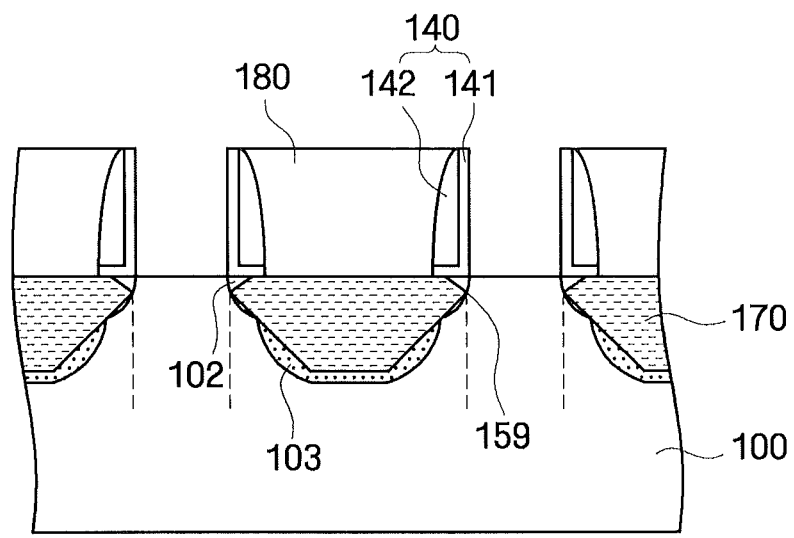
Figure 15:
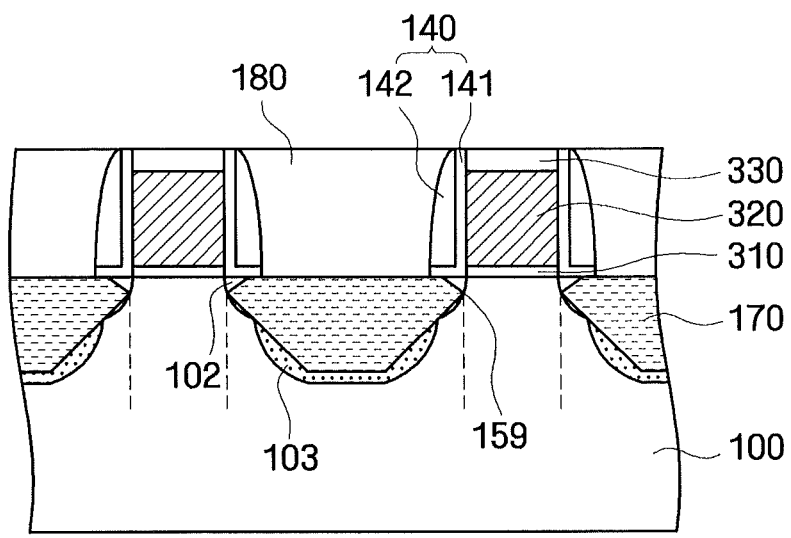

A method of fabricating a semiconductor device according to another embodiment of the present invention will now be described with reference to FIGS. 13 to 15. FIGS. 13 to 15 are cross-sectional views sequentially illustrating intermediate stages in a method of fabricating a semiconductor device according to another embodiment of the present invention.

Referring to FIG. 13, the method of fabricating a semiconductor device according to the illustrated embodiment of the present invention is different from the method according to the previous embodiment in that a dummy gate pattern 210, a dummy gate electrode 220, and a dummy gate sacrificial layer 230 are used.

Specifically, the dummy gate insulating layer 210, the dummy gate electrode 220, and the dummy gate capping layer 230 are formed on the substrate 100. The dummy gate insulating layer 210 may be formed of a silicon oxide layer. The dummy gate electrode 220 may be made of poly-Si, and the dummy gate capping layer 230 may be made of SiN, or SiON. The reason of using the dummy gate electrode 220 is because processing temperatures of subsequent processes, for example, processes of forming the lightly/heavily doped impurity regions 102 and 103, are higher than a melting point of a metallic material used for a gate electrode (320 of FIG. 15).

Next, the epitaxial layer forming trench 157 is completed by the fabricating method shown in FIGS. 2 to 11, and the SiGe epitaxial layer 170 is formed in the epitaxial layer forming trench 157. Subsequently, an interlayer dielectric layer 180 filling the dummy gate pattern 210, the dummy gate electrode 220, the dummy gate capping layer 230, and the spacer 140 can be formed on the substrate 100, and the interlayer dielectric layer 180 is planarized until a top surface of the dummy gate capping layer 230 is exposed.

Referring to FIG. 14, the dummy gate insulating layer 210, the dummy gate electrode 220, and the dummy gate capping layer 230 are selectively removed to form the gate forming trench 250. Alternatively, the dummy gate insulating layer 210 may not be removed. The dummy gate insulating layer 210, the dummy gate electrode 220, and the dummy gate capping layer 230 may be removed by reactive ion etching.

Referring to FIG. 15, a gate insulating layer 310, a gate electrode 320, and a gate capping layer 330 are formed in the gate forming trench 250. The gate insulating layer 310 may be made of a high-k material such as $HfO_2$, $ZrO_2$, $Al_2O_3$, $Ta_2O_5$, hafnium silicate, zirconium silicate, or a combination thereof. The gate electrode 320 may be made of a metal such as Al, W, Ta, TaN, TaSiN, TiN, Mo, Ru, Ni, or NiSi. The gate capping layer 130 may be made of SiN, or SiON.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device comprising:
    forming a gate electrode on a substrate;
    forming a spacer on sidewalls of the gate electrode;
    etching a predetermined portion of the substrate exposed by the spacer and the gate electrode to form a first preliminary trench;
    forming a sacrificial layer on a bottom surface of the first preliminary trench that exposes a sidewall of the first preliminary trench;
    laterally etching the sidewall of the first preliminary trench to form a second preliminary trench;
    removing the sacrificial layer;
    etching the second preliminary trench to form a trench; and
    forming a SiGe epitaxial layer in the trench, wherein the trench has a hexagonal profile;
    wherein etching the second preliminary trench is performed by crystallographic anisotropic etching based on wet etching;
    wherein KOH, NaOH, $NH_4OH$, or tetramethyl ammonium hydroxide (TMAH) is used as an etching solution in the crystallographic anisotropic etching based on wet etching;
    wherein laterally etching the sidewall of the first preliminary trench comprises laterally etching the sidewall of the first preliminary trench exposes a predetermined portion of a bottom surface of the spacer beneath the substrate; and
    wherein a location on a sidewall of the second preliminary trench defining a maximum width thereof is closer to a top surface of the substrate than a location on the sidewall of the first preliminary trench defining a maximum width thereof.

2. The method of claim 1, wherein the sidewall of the second preliminary trench is closer to a channel region beneath the gate electrode than the sidewall of the first preliminary trench.

3. The method of claim 1, wherein the sacrificial layer comprises a high-density plasma (HDP) oxide layer.

4. The method of claim 3, wherein removing the sacrificial layer comprises sequentially cleaning using $O_3HF$ and plasma native oxide cleaning (PNC) or pre native oxide cleaning.

5. The method of claim 1, wherein a distance from the top surface of the substrate to a tip of a sidewall of the trench is 7 nm or less.

6. The method of claim 5, wherein the tip is aligned with a sidewall of the gate electrode.

7. The method of claim 1, wherein etching the predetermined portion of the substrate comprises etching the predetermined portion of the substrate using an etch back process.

8. The method of claim 1, further comprising:
    forming a lightly doped impurity region by implanting low concentration impurity ions into the substrate using the gate electrode as an ion implantation mask before the forming the spacer on the sidewalls of the gate electrode; and forming a heavily doped impurity region by implanting high concentration impurity ions into the substrate using the gate electrode and the spacer as ion implantation mask before the forming the first preliminary trench.

9. The method of claim 1, wherein a top surface of the SiGe epitaxial layer is as high as the top surface of the substrate.

10. The method of claim 1, wherein a top surface of the SiGe epitaxial layer is higher than the top surface of the substrate.

11. A method of fabricating a semiconductor device comprising:
    forming a gate electrode on a substrate;
    forming a spacer on sidewalls of the gate electrode;
    forming a first trench by etching a predetermined portion of the substrate exposed by the spacer and the gate electrode;
    forming a sacrificial layer on a bottom surface of the first trench;
    forming a second trench having a maximum width greater than that of the first trench by laterally etching the sidewalls of the first trench exposed by the sacrificial layer, wherein laterally etching the sidewalls of the first trench comprises anisotropically laterally etching the sidewalls of the first trench so that locations on opposing sidewalls of the second trench defining a maximum width thereof are closer to a top surface of the substrate than locations on the opposing sidewalls of the first trench defining a maximum width thereof;
    etching the second trench to form a hexagonal profile epi-trench; and
    forming a SiGe epitaxial layer in the hexagonal profile epi-trench.

12. A method of fabricating a semiconductor device comprising:
    forming a sacrificial layer on a bottom surface of a preliminary trench;
    etching sidewalls of preliminary trench in a substrate between immediately adjacent gate electrode structures to recess the sidewalls further beneath the gate electrode structures to provide recessed sidewalls, wherein etching the sidewalls of the preliminary trench comprises anisotropically laterally etching the sidewalls of the preliminary trench to provide upward-shifted profiles for the recessed sidewalls so that a curved profile of each of the recessed sidewalls is shifted upward toward a top surface of the substrate relative to respective profiles of the sidewalls of the preliminary trench, as a result of the anisotropically laterally etching of the sidewalls of the preliminary trench; and then
    etching the recessed sidewalls and a bottom of the preliminary trench using crystallographic anisotropic etching to form a hexagonally shaped trench in the substrate; and
    epitaxially growing a SiGe layer in the hexagonally shaped trench.

13. The method according to claim 12 wherein etching the recessed sidewalls comprises etching the recessed sidewalls to form outermost tips of the hexagonally shaped trench beneath the immediately adjacent gate electrode structures.

14. The method according to claim 13 wherein the outermost tips are aligned to sidewalls of the immediately adjacent gate electrode structures.

15. The method according to claim 13 wherein the outermost tips are 7 nm or less beneath a surface of the substrate.

16. The method according to claim 12 wherein forming a sacrificial layer comprises forming the sacrificial layer on the bottom surface of the preliminary trench and exposing at least a portion of the sidewall of the preliminary trench.

* * * * *